（12）United States Patent
Basceri

(10) Patent No.: US 7,358,188 B2
(45) Date of Patent: Apr. 15, 2008

(54) METHOD OF FORMING CONDUCTIVE METAL SILICIDES BY REACTION OF METAL WITH SILICON

(75) Inventor: Cem Basceri, Reston, VA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/362,119

(22) Filed: Feb. 23, 2006

(65) Prior Publication Data

US 2007/0059930 A1    Mar. 15, 2007

Related U.S. Application Data

(63) Continuation of application No. 10/689,958, filed on Oct. 20, 2003, now Pat. No. 7,026,243.

(51) Int. Cl.
*H01L 21/44* (2006.01)
(52) U.S. Cl. ............... 438/682; 438/683; 438/685; 438/686; 438/649; 438/651; 257/E21.507; 257/E21.576; 257/E21.584; 257/E21.59
(58) Field of Classification Search ........... 438/682, 438/683, 685, 686, 648, 651, 656
See application file for complete search history.

(56) References Cited

U.S. PATENT DOCUMENTS

| | | |
|---|---|---|
| 3,349,474 A | 10/1967 | Rauscher |
| 3,772,101 A | 11/1973 | Chumbres et al. |
| 3,934,057 A | 1/1976 | Moreau et al. |
| 4,086,074 A | 4/1978 | Minot et al. |
| 4,180,596 A | 12/1979 | Crowder et al. |
| 4,622,735 A | 11/1986 | Shibata |
| 4,645,562 A | 2/1987 | Liao et al. |
| 4,683,645 A | 8/1987 | Naguib et al. |
| 4,693,910 A | 9/1987 | Nakajima et al. |
| 4,766,090 A | 8/1988 | Coquin et al. |
| 5,099,304 A | 3/1992 | Takemura et al. |

(Continued)

FOREIGN PATENT DOCUMENTS

EP    0 851 473 A2    7/1998

(Continued)

OTHER PUBLICATIONS

U.S. Appl. No. 10/655,997, filed Sep. 2003, Daley.

(Continued)

*Primary Examiner*—Alexander Ghyka
(74) *Attorney, Agent, or Firm*—Wells St. John P.S.

(57) ABSTRACT

The invention includes methods of forming conductive metal silicides by reaction of metal with silicon. In one implementation, such a method includes providing a semiconductor substrate comprising an exposed elemental silicon containing surface. At least one of a nitride, boride, carbide, or oxide comprising layer is atomic layer deposited onto the exposed elemental silicon containing surface to a thickness no greater than 15 Angstroms. Such layer is exposed to plasma and a conductive reaction layer including at least one of an elemental metal or metal rich silicide is deposited onto the plasma exposed layer. Metal of the conductive reaction layer is reacted with elemental silicon of the substrate effective to form a conductive metal silicide comprising contact region electrically connecting the conductive reaction layer with the substrate. Other aspects and implementations are contemplated.

48 Claims, 2 Drawing Sheets

U.S. PATENT DOCUMENTS

| | | | |
|---|---|---|---|
| 5,236,865 A | 8/1993 | Sandhu et al. |
| 5,275,695 A | 1/1994 | Chang et al. |
| 5,406,123 A | 4/1995 | Narayan |
| 5,444,024 A | 8/1995 | Anjum et al. |
| 5,470,784 A | 11/1995 | Coleman |
| 5,470,794 A | 11/1995 | Anjum et al. |
| 5,670,298 A | 9/1997 | Hur |
| 5,677,102 A | 10/1997 | Shiihara |
| 5,904,517 A | 5/1999 | Gardner et al. |
| 5,955,244 A | 9/1999 | Duval |
| 5,994,194 A | 11/1999 | Lammert |
| 5,998,264 A | 12/1999 | Wu |
| 6,013,582 A | 1/2000 | Ionov et al. |
| 6,037,239 A | 3/2000 | Jennings |
| 6,096,621 A | 8/2000 | Jennings |
| 6,096,634 A | 8/2000 | Nguyen |
| 6,130,140 A | 10/2000 | Gonzalez |
| 6,133,105 A | 10/2000 | Chen et al. |
| 6,133,116 A | 10/2000 | Kim et al. |
| 6,156,674 A | 12/2000 | Li et al. |
| 6,165,834 A | 12/2000 | Agarwal et al. |
| 6,169,019 B1 | 1/2001 | Takagi |
| 6,177,235 B1 | 1/2001 | Francou et al. |
| 6,180,465 B1 | 1/2001 | Gardner et al. |
| 6,188,097 B1 | 2/2001 | Derderian et al. |
| 6,207,485 B1 | 3/2001 | Gardner et al. |
| 6,238,994 B1 | 5/2001 | Derderian et al. |
| 6,255,035 B1 | 7/2001 | Minter et al. |
| 6,277,709 B1 | 8/2001 | Wang et al. |
| 6,277,728 B1 | 8/2001 | Ahn et al. |
| 6,281,100 B1 | 8/2001 | Yin et al. |
| 6,291,363 B1 | 9/2001 | Yin et al. |
| 6,297,527 B1 | 10/2001 | Agarwal et al. |
| 6,350,560 B1 | 2/2002 | Sahbari |
| 6,376,149 B1 | 4/2002 | Grober et al. |
| 6,380,611 B1 | 4/2002 | Yin et al. |
| 6,383,723 B1 | 5/2002 | Iyer et al. |
| 6,399,982 B1 | 6/2002 | Derderian et al. |
| 6,440,793 B1 | 8/2002 | Divakaruni et al. |
| 6,465,325 B2 | 10/2002 | Ridley et al. |
| 6,511,896 B2 | 1/2003 | Basceri et al. |
| 6,548,854 B1 | 4/2003 | Kizilyalli et al. |
| 6,582,861 B2 | 6/2003 | Buxbaum et al. |
| 6,582,888 B1 | 6/2003 | Herbst et al. |
| 6,608,343 B2 | 8/2003 | Derderian et al. |
| 6,613,240 B2 | 9/2003 | Skinner et al. |
| 6,617,250 B2 | 9/2003 | Basceri et al. |
| 6,649,466 B2 | 11/2003 | Basceri et al. |
| 6,720,638 B2 | 4/2004 | Tran |
| 6,744,093 B2 | 6/2004 | Agarwal et al. |
| 6,746,916 B2 | 6/2004 | Agarwal et al. |
| 6,753,618 B2 | 6/2004 | Basceri et al. |
| 6,777,739 B2 | 8/2004 | Agarwal et al. |
| 6,780,728 B2 | 8/2004 | Tran |
| 6,780,766 B2 | 8/2004 | Basceri et al. |
| 6,817,086 B2 | 11/2004 | Lu et al. |
| 6,838,363 B2 | 1/2005 | Wieczorek et al. |
| 6,844,131 B2 | 1/2005 | Oberlander et al. |
| 6,900,497 B2 | 5/2005 | Agarwal et al. |
| 6,943,126 B1 | 9/2005 | Narayanan et al. |
| 6,956,980 B2 | 10/2005 | Nagata et al. |
| 6,969,677 B2 | 11/2005 | Derderian et al. |
| 7,026,243 B2 * | 4/2006 | Basceri .................. 438/682 |
| 2001/0006759 A1 | 7/2001 | Shipley, Jr. et al. |
| 2002/0064969 A1 | 5/2002 | Havemann |
| 2002/0076879 A1 | 6/2002 | Lee et al. |
| 2002/0196651 A1 | 12/2002 | Weis |
| 2003/0013272 A1 | 1/2003 | Hong et al. |
| 2003/0045060 A1 | 3/2003 | Ahn et al. |
| 2003/0045078 A1 | 3/2003 | Ahn et al. |
| 2003/0205729 A1 | 11/2003 | Basceri et al. |
| 2003/0211729 A1 | 11/2003 | Lee et al. |
| 2003/0213987 A1 | 11/2003 | Basceri et al. |
| 2003/0219942 A1 | 11/2003 | Choi et al. |
| 2004/0043228 A1 | 3/2004 | Derderian et al. |
| 2004/0046197 A1 | 3/2004 | Basceri et al. |
| 2004/0219736 A1 | 11/2004 | Yoshitaka |
| 2004/0245559 A1 | 12/2004 | Pontoh et al. |
| 2004/0245560 A1 | 12/2004 | Pontoh et al. |
| 2005/0035460 A1 | 2/2005 | Tseng |
| 2005/0244571 A1 | 11/2005 | Walheim et al. |
| 2005/0266619 A1 | 12/2005 | Brask et al. |
| 2005/0266664 A1 | 12/2005 | Harrison et al. |
| 2006/0183277 A1 | 8/2006 | Brask et al. |

FOREIGN PATENT DOCUMENTS

| | | |
|---|---|---|
| JP | 2002-323775 | 11/2002 |

OTHER PUBLICATIONS

ABSTRACT: Basceri et al., *Atomic Layer Deposition for Nanoscale CU Metalization*, 10 pages (pre-Apr. 2004).

Chang et al., *Silicon surface treatments in advanced MOS gate processing*, Microelectronic Engineering, pp. 130-135 (2004).

En et al., *Plasma immersion ion implantation reactor design considerations for oxide charging*, 85 Surface and Coatings Technology, pp. 64-69 (1966).

Ku et al., *The Application of Ion Beam Mixing, Doped Silicide, and Rapid Thermal Processing of Self-Aligned Silicide Technology*, 137 J. Electrochem. Soc. No. 2, pp. 728-740 (Feb. 1990).

Lemberger et al., *Electrical characterization and reliability aspects of zirconium silicate films obtained from novel MOCVD precursors*, Microelectronic Engineering, pp. 315-320 (2004).

ABSTRACT: Lin et al., *How to Eliminate Voiding in Porous-Low-k Dielectrics and The Mechanism of Void Formation*; 4 pages (pre-2003).

Lu et al., *Effects of the $TaN_x$ interface layer on doped tantalum oxide high-k films*, VACUUM pp. 1-9 (2004).

ABSTRACT: Park et al., *COB Stack DRAM Cell Technology beyond 100 nm Technology Node*, pp. 349.1-349.3 (pre-2003).

Robertson et al., *Atomic structure, band offsets, growth and defects at high-K oxide:Si enterfaces*, Microelectronic Engineering, (pp. 112-120 (2004).

Rubin et al., *Shallow-Junction Diode Formation by implantation of Arsenic and Boron Through Titanium-Silicide Films and . . .* , 17 IEEE Transactions on Electron Devices, No. 1, pp. 183-190 (Jan. 1990).

Singh et al., *High and Low Dielectric Constant Materials*, The Electrochemical Society Interface, pp. 26-30 (Summer 1999).

U.S. Appl. No. 10/609,311, filed Jun. 2003, Yates.
U.S. Appl. No. 10/689,958, filed Oct. 2003, Basceri.
U.S. Appl. No. 10/822,118, filed Apr. 2004, Sandhu et al.
U.S. Appl. No. 10/879,367, filed Jun. 2004, Blalock et al.
U.S. Appl. No. 10/932,218, filed Sep. 2004, Basceri et al.

* cited by examiner

METHOD OF FORMING CONDUCTIVE METAL SILICIDES BY REACTION OF METAL WITH SILICON

RELATED PATENT DATA

This patent resulted from a continuation application of U.S. patent application Ser. No. 10/689,958, filed Oct. 20, 2003 now U.S. Pat. No. 7,026,243, entitled "Methods of Forming Conductive Metal Silicides by Reaction of Metal With Silicon", naming Cem Basceri as inventors, the disclosure of which is incorporated by reference.

TECHNICAL FIELD

This invention relates to methods of forming conductive metal silicides by reaction of metal with silicon.

BACKGROUND OF THE INVENTION

Integrated circuits typically use various combinations of insulative materials, conductive materials, and semiconductive materials (including conductively doped semiconductive material). One type of conductive material which is utilized is elemental metals. In the context of this document, an "elemental metal" is defined to mean any one or more metal element(s) in element form, including any alloy of two or more metal elements. In many instances, it is desired to form a metal into electrical connection with a crystalline silicon substrate, for example conductively doped crystalline silicon. However, the physical contact of an elemental metal with a crystalline silicon substrate inherently creates undesired excessive electrical resistance between the two materials.

One common way of reducing this resistance is to form an interfacing silicide region at the junction or interface of the metal with the silicon. Thereby, a silicon-silicide-metal interfacing electrical connection is formed. One manner of forming the silicide is merely by heating the substrate with the two contacting layers to a suitable temperature for a sufficient period of time, typically in an inert atmosphere, to cause a reaction of metal and silicon to form the metal silicide. Alternately or in addition thereto, the deposition conditions for the metal material deposited over the silicon can be effectively high to impart a reaction of the depositing metal with the underlying silicon in situ during deposition. Regardless, the silicide which forms results from reaction of the metal with the underlying silicon substrate. The reaction is typically self-limiting such that further processing or exposure to temperature at some point stops resulting in silicide formation.

Integrated circuitry fabrication continues to strive to make ever denser and smaller electronic devices of the circuitry. One place where silicide contact structures are utilized is in the electrical connection of source/drain diffusion regions of field effect transistors with overlying conductive metal lines. As the device components get smaller and denser, it is highly desirable to precisely control the amount of silicide which is formed in such contacts, as well as in other devices where silicide interfaces between metal and silicon are desired to be formed. For example in some instances in present-generation processing, it is desirable to fabricate the silicide regions over the substrates to have thicknesses of from 50 Angstroms to 100 Angstroms. Further, it is expected that the thickness of silicide regions in later-generation processing will fall below 50 Angstroms. Regardless, the variation in thickness of silicide regions formed over a substrate using typical prior art processing has been found to be anywhere from 20 Angstroms to 25 Angstroms across the substrate. This variability is undesirable and constitutes a 20% to 25% thickness variation for desired 100 Angstroms thick silicide regions, and a 40% to 50% variation in thickness for desired 50 Angstroms thick silicide regions. It would be desirable to develop methods which enable tighter thickness control of silicide regions which are formed across a substrate, and particularly where the silicide regions being formed have thicknesses that are no greater than 100 Angstroms where the above problem particularly manifests.

While the invention was motivated in addressing the above described issues, it is in no way so limited. The invention is only limited by the accompanying claims as literally worded, without interpretative or other limiting reference to the specification, and in accordance with the doctrine of equivalents.

SUMMARY

The invention includes methods of forming conductive metal silicides by reaction of metal with silicon. In one implementation, such a method includes providing a semiconductor substrate comprising an exposed elemental silicon containing surface. At least one of a nitride, boride, carbide, or oxide comprising layer is atomic layer deposited onto the exposed elemental silicon containing surface to a thickness no greater than 15 Angstroms. Such layer is exposed to plasma and a conductive reaction layer comprising at least one of an elemental metal or metal rich silicide is deposited onto the plasma exposed layer. Metal of the conductive reaction layer is reacted with elemental silicon of the substrate effective to form a conductive metal silicide comprising contact region electrically connecting the conductive reaction layer with the substrate.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
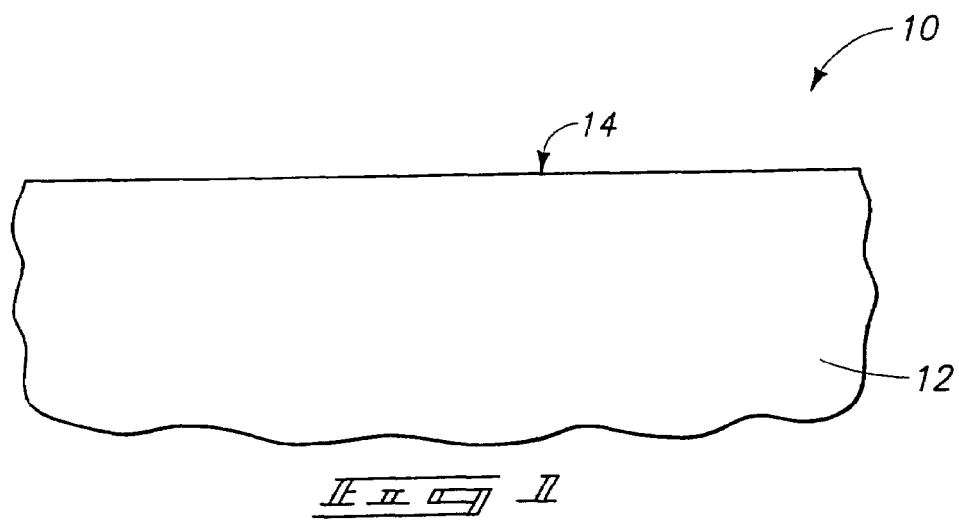
FIG. 1 is a diagrammatic sectional view of a semiconductor wafer fragment in process in accordance with an aspect of the invention.

Exemplary preferred methods of forming a conductive metal silicide by reaction of metal with silicon are described with reference to FIGS. 1-6. Referring initially to FIG. 1, a substrate fragment is indicated generally with reference numeral 10, and comprises a semiconductor substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Accordingly, semiconductor substrate 12 might comprise various structures and/or composites and/or mixtures of insulative, conductive and semiconductive materials. Regardless in the context of the invention, semiconductor substrate 12 comprises some exposed elemental silicon containing surface 14. Such might be a substantially global surface across the entirety of the substrate being processed, or one or more isolated regions of exposed elemental silicon. For example, and by way of example only, an exposed silicon surface might constitute the outer surface of a conductive diffusion region formed of conductively doped monocrystalline or polycrystalline silicon exposed through a contact opening formed in an insulative material layer or layers. Regardless in one aspect, exposed elemental silicon containing surface 14 comprises monocrystalline silicon (including epitaxially grown silicon) and/or polycrystalline silicon. Exposed elemental silicon containing surface also or alternately might comprise silicon from a silicon-rich silicon compound.

Figure 2:
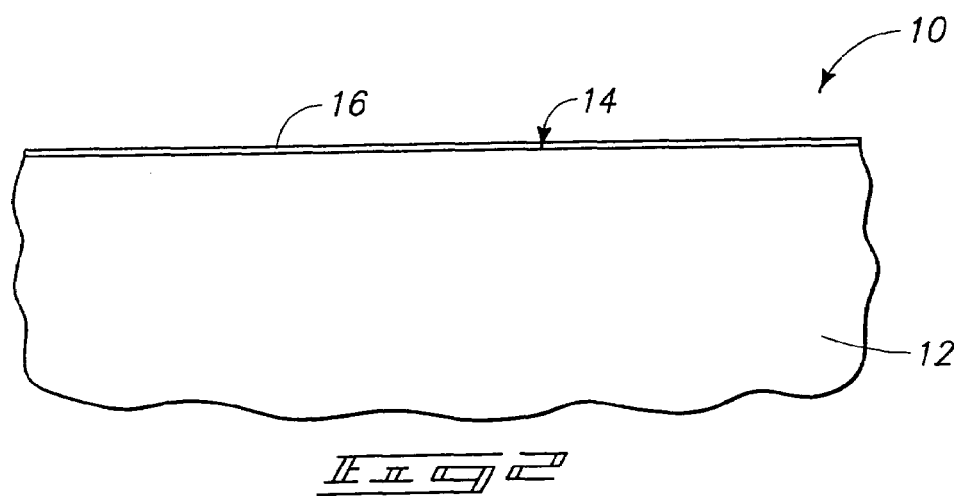
FIG. 2 is a view of the FIG. 1 fragment at a processing step subsequent to that shown by FIG. 1.

Referring to FIG. 2, a layer 16 comprising at least one of a nitride, boride, carbide or oxide is atomic layer deposited onto exposed elemental silicon containing surface 14 to a thickness no greater than 15 Angstroms. Accordingly, layer 16 might comprise any one or combination of nitrides, borides, carbides or oxides. Atomic layer depositing (ALD) typically involves formation of successive atomic layers on a substrate. Such layers may comprise, for example, epitaxial, polycrystalline, and/or amorphous material. Described in summary, ALD includes exposing an initial substrate to a first chemical species to accomplish chemisorbtion of the species onto the substrate. Theoretically, the chemisorbtion forms a monolayer that is uniformly one atom or molecule thick on the entire exposed initial substrate. In other words, a saturated monolayer is preferably formed. Practically, chemisorbtion might not occur on all portions or completely over the desired substrate surfaces. Nevertheless, such an imperfect monolayer is still considered a monolayer. In many applications, merely a substantially saturated monolayer may be suitable. A substantially saturated monolayer is one that will still yield a deposited layer exhibiting the quality and/or properties desired for such layer.

The first species is purged from over the substrate and a second chemical species is provided to chemisorb onto the first monolayer of the first species. The second species is then purged and the steps are repeated with exposure of the second species monolayer to the first species. In some cases, the two monolayers may be of the same species. Also, a third species or more may be successively chemisorbed and purged just as described for the first and second species. Further, one or more of the first, second and third species can be mixed with inert gas to speed up pressure saturation within a reaction chamber.

Purging may involve a variety of techniques including, but not limited to, contacting the substrate and/or monolayer with a carrier gas and/or lowering pressure to below the deposition pressure to reduce the concentration of a species contacting the substrate and/or chemisorbed species. Examples of carrier gases include $N_2$, Ar, He, Ne, Kr, Xe, etc. Purging may instead include contacting the substrate and/or monolayer with any substance that allows chemisorption byproducts to desorb and reduces the concentration of a species preparatory to introducing another species. A suitable amount of purging can be determined experimentally as known to those skilled in the art. Purging time may be successively reduced to a purge time that yields an increase in film growth rate. The increase in film growth rate might be an indication of a change to a non-ALD process regime and may be used to establish a purge time limit.

ALD is often described as a self-limiting process in that a finite number of sites exist on a substrate to which the first species may form chemical bonds. The second species might only bond to the first species and thus may also be self-limiting. Once all of the finite number of sites on a substrate are bonded with a first species, the first species will often not bond to other of the first species already bonded with the substrate. However, process conditions can be varied in ALD to promote such bonding and render ALD not self-limiting. Accordingly, ALD may also encompass a species forming other than one monolayer at a time by stacking of a species, forming a layer more than one atom or molecule thick. Further, local chemical reactions can occur during ALD (for instance, an incoming reactant molecule can displace a molecule from an existing surface rather than forming a monolayer over the surface). To the extent that such chemical reactions occur, they are generally confined within the uppermost monolayer of a surface.

Traditional ALD can occur within frequently-used ranges of temperature and pressure and according to established purging criteria to achieve the desired formation of an overall ALD layer one monolayer at a time. Even so, ALD conditions can vary greatly depending on the particular precursors, layer composition, deposition equipment, and other factors according to criteria known by those skilled in the art. Maintaining the traditional conditions of temperature, pressure, and purging minimizes unwanted reactions that may impact monolayer formation and quality of the resulting overall ALD layer. Accordingly, operating outside the traditional temperature and pressure ranges may risk formation of defective monolayers.

With respect to layer 16, exemplary preferred nitrides include tantalum nitride, titanium nitride, tungsten nitride, boron nitride, aluminum nitride, hafnium nitride, and mixtures thereof. Preferably where any nitride is present, such nitride is void of silicon nitride due to. its excessive resistivity. Exemplary preferred borides include tungsten boride, titanium boride, and mixtures thereof. Exemplary preferred carbides include tantalum carbide, titanium carbide, silicon carbide, and mixtures thereof. Exemplary preferred oxides include rhodium oxide, ruthenium oxide, iridium oxide, and mixtures thereof. Where oxide is present, such is preferably void of $SiO_2$ due to its excessive resistance. While the disclosed invention does not preclude presence or use of silicon nitride or silicon dioxide, such are not preferred. Further preferably, exposed elemental silicon containing surface 14 is subjected to an HF dip prior to atomic layer depositing of layer 16 thereover.

ALD layer 16 preferably has a thickness which is no less than 5 Angstroms, with a more preferred thickness range being from 5 Angstroms to 10 Angstroms.

In one implementation, layer 16 as-deposited to a thickness no greater than 15 Angstroms has a resistance greater than 1000 microohms-cm.

In one exemplary preferred reduction-to-practice example, layer 16 comprises tantalum nitride, for example atomic layer deposited from precursors comprising pentakis-dimethylamido-tantalum (PDMAT) and ammonia. For example, and by way of example only, atomic layer deposition conditions include a substrate temperature of from 125° C. to 400° C., PDMAT carrier gas flow (Ar) in the range of 100 sccm to 175 sccm, and $NH_3$ flow in the range of 1000 sccm to 1750 sccm. Exemplary preferred cycle sequences include 75 milliseconds to 2000 milliseconds of PDMAT pulse length, 250 milliseconds to 2250 milliseconds of Ar purge after each PDMAT pulse, 125 milliseconds to 2500 milliseconds of $NH_3$ pulse length, and 500 milliseconds to 2000 milliseconds Ar purge after each $NH_3$ pulse. A specific example, and by way of example only, is 500 millisecond PDMAT pulses, 500 millisecond Ar purges, 1000 millisecond $NH_3$ pulses, and 500 millisecond Ar purges. Precursor carrier and $NH_3$ flows were 100 sccm and 1000 sccm, respectively. Growth rate of approximately 0.7 Angstroms per cycle was achieved, indicating each cycle was not resulting in complete saturation. A more preferred temperature range is from 175° C. to 300° C., with 275° C. being a specific preferred example.

Figure 3:
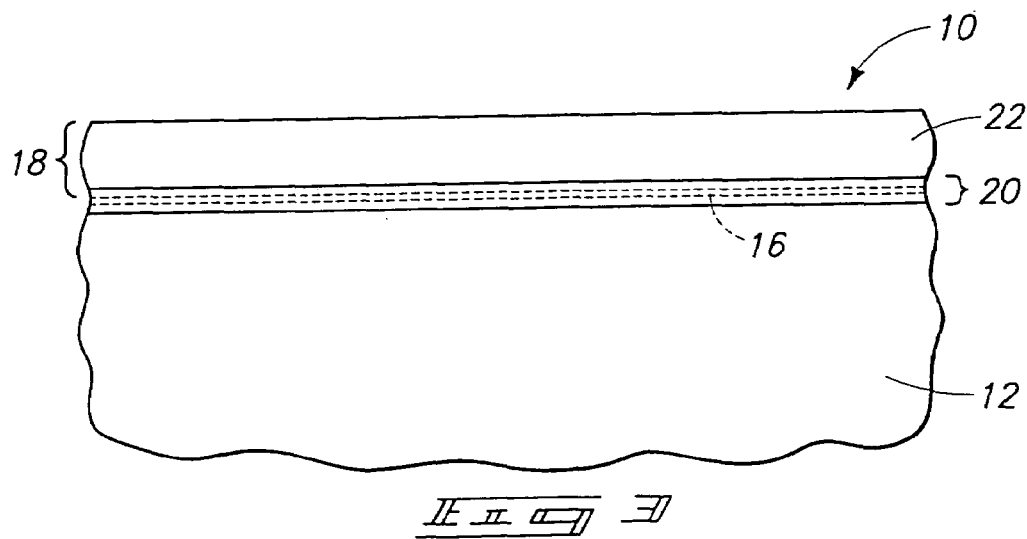
FIG. 3 is a view of the FIG. 1 fragment at a processing step subsequent to that shown by FIG. 2.

Referring to FIG. 3, ALD layer 16 has been exposed to plasma and a conductive reaction layer 18 comprising at least one of an elemental metal or metal rich silicide has been deposited onto plasma exposed layer 16. Metal of conductive reaction layer 18 is reacted with elemental silicon of substrate 12 effective to form a conductive metal silicide comprising contact region 20 which electrically connects conductive reaction layer 18 with substrate 12. Conductive metal silicide comprising contact region 20 preferably has a thickness from 5 Angstroms to 100 Angstroms. FIG. 3 depicts an upper un-reacted portion 22 of conductive reaction layer 18, whereby a lower portion of layer 18 has reacted to form silicide with silicon of substrate 12. In one preferred example, outer portion 22 of conductive reaction layer 18 at least predominately comprises elemental metal, and in another example consists essentially of elemental metal. In one exemplary embodiment, outer portion 22 of conductive reaction layer 18 at least predominately comprises metal rich silicide, and in another example consists essentially of metal rich silicide. By way of example only, exemplary elemental metals include titanium, nickel, ruthenium, cobalt, tungsten, iridium, molybdenum, and mixtures thereof. Exemplary metal rich silicides include metal silicides of these exemplary metals, including mixtures thereof. In one embodiment, the at least one of a nitride, boride, carbide, or oxide of layer 16 of FIG. 2 is of a metal which is different from the metal of the conductive reaction layer. In one exemplary embodiment, the at least one of the nitride, boride, carbide, or oxide of layer 16 of FIG. 2 is of a metal which is the same as the metal of the conductive reaction layer.

One exemplary preferred and reduction-to-practice material for conductive reaction layer 18 comprises at least one of titanium and titanium rich titanium silicide. Further by way of example only, titanium and titanium rich titanium silicides can be deposited utilizing halides, such as $TiCl_4$. An exemplary preferred technique for depositing elemental titanium utilizes a capacitively coupled, single wafer processor, for example a Centura™ reactor available from Applied Materials of Santa Clara, Calif. Exemplary substrate temperature conditions during deposit of either a titanium or titanium rich metal silicide layer include from 550° C. to 700° C. An exemplary preferred pressure range is from 1 Torr to 10 Torr, with an exemplary RF applied power being from 50 Watts to 500 Watts. An exemplary flow rate of the $TiCl_4$ is from 50 mg/min to 500 mg/min, with an exemplary additional gas flows of Ar and $H_2$ each being from 50 sccm to 500 sccm. If a titanium rich titanium silicide is to be deposited, a suitable silane could also be flowed and/or pulsed to the deposition reactor at volumetric flow rates sufficiently spaced or suitably low to result in excess elemental titanium in the titanium silicide layer being formed. Conductive reaction layer 18 might be of the same, greater or lesser thickness as that of crystalline form layer 16, with greater thickness being preferred.

The above stated exposing of the ALD layer to plasma, the depositing of a conductive reaction layer, and the reacting to form a conductive metal silicide comprising contact region can occur separately or in various combinations. For example where a conductive reaction layer depositing is by a plasma deposition, such act of depositing with plasma can constitute some or all of the ALD layer exposing to plasma. Accordingly in such example, at least some of such ALD layer exposing to plasma occurs during the depositing of the conductive reaction layer. If there is no plasma exposure of the ALD layer prior to a plasma deposition of the conductive layer, then the exposing would only occur during a plasma deposition of the conductive reaction layer.

Figure 4:
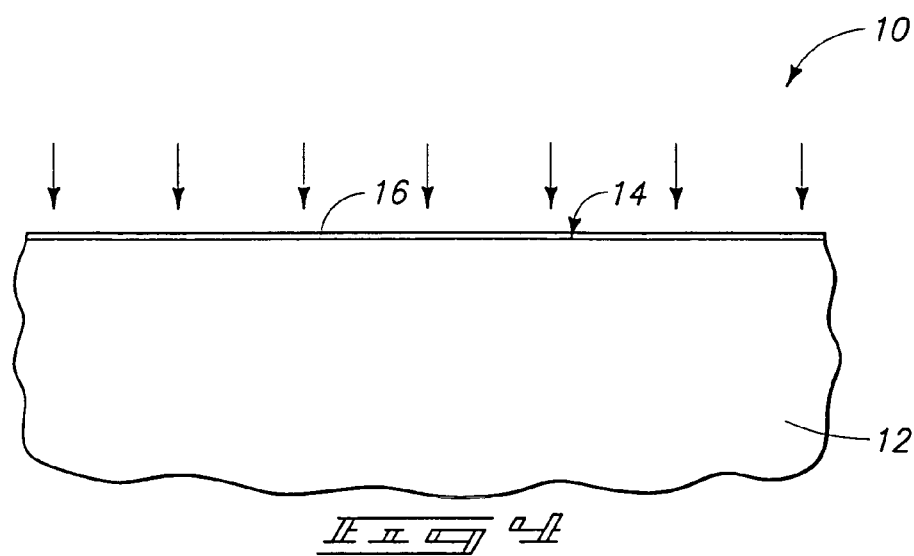
FIG. 4 is view of the FIG. 1 fragment at a processing step subsequent to that shown by FIG. 2.

FIG. 4 diagrammatically depicts by the downwardly directed arrows ALD layer 16 being exposed to plasma prior to and separate of the depositing of conductive reaction layer 18 as depicted by FIG. 3. As stated above, some plasma exposure of layer 16 is contemplated in accordance with the invention. Such plasma exposure might all occur during the deposition of the conductive reaction layer, all of such exposing prior to and separate of the deposition of the conductive reaction layer, or both before and during deposition of the conductive reaction layer.

Figure 5:
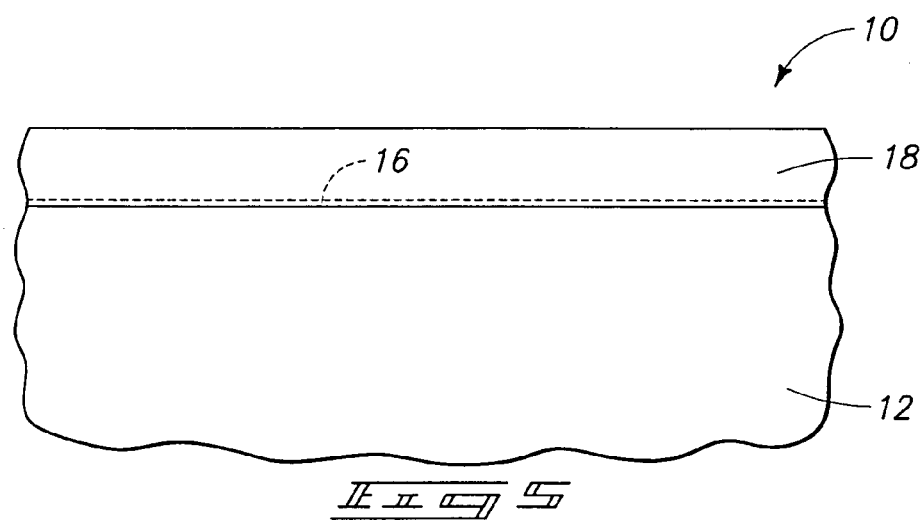
FIG. 5 is a view of the FIG. 1 fragment at a processing step subsequent to that shown by FIG. 2.

Further regarding reacting of metal of the conductive reaction layer with elemental silicon of the substrate to form a conductive metal silicide comprising contact region, such reacting might occur during the conductive reaction layer depositing, after the depositing, or both during and after the depositing. By way of example only, FIG. 5 depicts a conductive reaction layer 18 deposited over ALD layer 16 in a manner wherein negligible if any reaction to form a conductive metal silicide comprising contact region occurs. Such might result if deposition of layer 18 were conducted at suitably low temperatures to preclude appreciable reaction of metal of layer 18 with silicon of substrate 12, with or without plasma. If so and regardless, a silicidation reaction between metal of layer 18 and silicon of substrate 12 could be achieved by exposure of the substrate to a suitable temperature, for example from 400° C. to 700° C. for an exemplary time period of from 30 seconds to 5 minutes to, for example, produce the structure of FIG. 3. Regardless, it is possible that the combination of the exposing, depositing, and reacting might be effective to substantially break up and/or diffuse layer 16 relative to one or both of conductive reaction layer 18 or region 20 such that layer 16 may no longer be distinguishable or have the same boundaries as initially deposited.

Processing as described in the above exemplary preferred embodiments produces certain unexpected advantages and results. However, such advantages or results do not constitute part of the invention unless literally appearing in a particular claim under analysis. In one preferred implementation, the exposing of the ALD layer to plasma and reacting to form the conductive metal silicide comprising contact region is effective to reduce resistance of the ALD layer to have an intrinsic resistance less than 1000 microohms-cm, and more preferably to have an intrinsic resistance less than 800 microohms-cm. For example, deposition of an elemental titanium layer by PECVD as described above was discovered to reduce intrinsic resistivity of an ALD tantalum nitride film of from 5 Angstroms to 10 Angstroms in thickness to about 700 microohms-cm. This was unexpected as the as-deposited film had intrinsic resistance well in excess of 1000 microohms-cm. The mechanism for such advantageous results is not fully understood. Without being limited to any theory of invention, one possibility is tunneling or diffusion of the formed silicide material through the ALD layer of thickness no greater than 15 Angstroms. An alternate or additional theory is that the plasma attack or exposure onto the ALD layer is favorably reducing resistivity of such layer. An alternate or additional theory is that the exposure to plasma, the depositing of the conductive reaction layer, and the reacting to form metal silicide is resulting in layer 16 not being continuous, thereby enhancing conductivity (reducing resistivity). Further and regardless, some or much of layer 16 from one or more of such acts might be diffusing into and relative to silicide region 20 being formed. Regardless, in one aspect of the invention resistance is reduced to a value below 1000 microohms-cm, and more preferably to a value below 800 microohms-cm.

Another advantageous result in one implementation is that the exposing, depositing and reacting result in better control (less variation) in the thickness of the metal silicide formed by the reaction. Accordingly in one implementation, the exposing, depositing and reacting are effective to form all conductive metal silicide formed over the substrate by the reacting to have no more than 10% thickness variation as determined as the percentage of the thickness portion of the conductive metal silicide formed by the reacting. In another preferred implementation, such thickness variation is from 1% to 3%, and in another preferred embodiment to have no more than 1% of such thickness variation. In one exemplary reduction-to-practice example, a thickest deposited portion of a metal silicide formed by the reacting was to 50 Angstroms, with the thickness variation across the substrate never exceeding 0.5 Angstrom of the metal silicide formed by the reacting.

Figure 6:
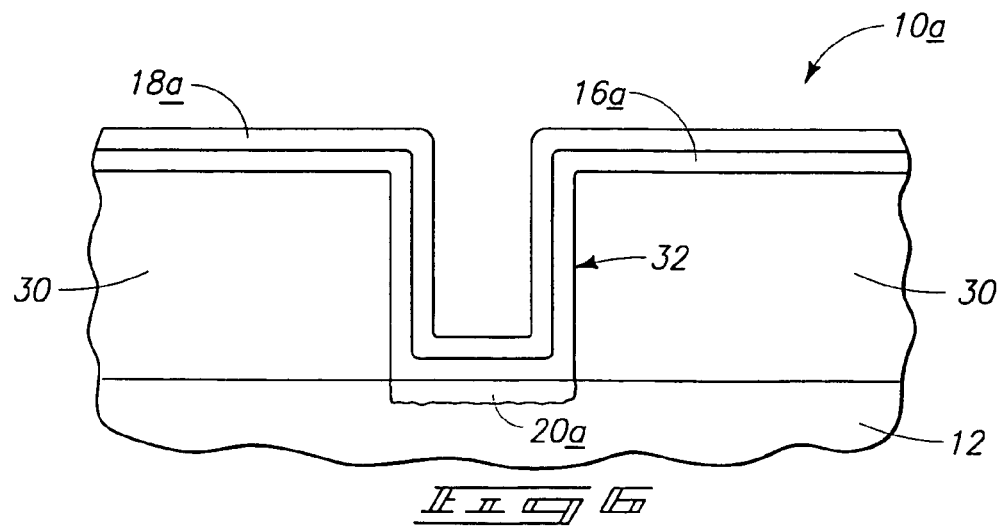
FIG. 6 is a diagrammatic sectional view of an alternate embodiment semiconductor wafer fragment in process in accordance with an aspect of the invention.

By way of example only, FIG. 6 depicts an alternate exemplary embodiment substrate fragment 10a. Like numerals form the-first described embodiments are utilized where appropriate, with differences being indicated with the suffix "a" or with different numerals. FIG. 6 depicts insulative material 30, for example comprising borophosphosilicate glass and undoped $SiO_2$, having been deposited over substrate 12. A contact opening 32 has been formed therethrough effective to expose some elemental silicon containing surface of substrate 12. Layer 16b, comprising at least one of a nitride, boride, carbide, or oxide comprising layer having a thickness no greater than 15 Angstroms, has been deposited. Processing has occurred in accordance with the broadest aspects above, including any of the various preferred attributes, effective to form conductive metal silicide comprising contact region 20a which electrically connects conductive reaction layer 18a with substrate 12. Further processing could occur, of course, including the forming of additional layers or the removing of the depicted layers without departing form the spirit and scope of the invention.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a conductive metal silicide by reaction of metal with silicon, comprising:
   providing a semiconductor substrate comprising an exposed elemental silicon-containing surface;
   depositing one or more monolayers to form at least one of a nitride, boride, carbide, or oxide-comprising layer onto the exposed elemental silicon-containing surface to a thickness no greater than 15 Angstroms;
   exposing the layer of thickness no greater than 15 Angstroms to plasma and depositing a conductive reaction layer comprising at least one of a first elemental metal or metal-rich silicide onto the plasma-exposed layer; and
   reacting said first metal or metal-rich silicide of the conductive reaction layer with the elemental silicon of the substrate effective to form a conductive metal silicide-comprising contact region electrically connecting the conductive reaction layer with the substrate.

2. The method of claim 1, wherein the monolayer depositing is of a nitride-comprising layer.

3. The method of claim 2, wherein the nitride-comprising layer is void of $Si_3N_4$.

4. The method of claim 1, wherein the monolayer depositing is of a boride-comprising layer.

5. The method of claim 1, wherein the monolayer depositing is of a carbide-comprising layer.

6. The method of claim 1, wherein the monolayer depositing is of an oxide-comprising layer.

7. The method of claim 6, wherein the oxide-comprising layer is void of $SiO_2$.

8. The method of claim 1, wherein the at least one of a nitride, boride, carbide, or oxide is of a second metal which is different from said first metal of the conductive reaction layer.

9. The method of claim 1, wherein the at least one of a nitride, boride, carbide, or oxide is of a second metal which is the same as said first metal of the conductive reaction layer.

10. The method of claim 1, wherein the layer of thickness no greater than 15 Angstroms is of a thickness no less than 5 Angstroms.

11. The method of claim 1, wherein the layer of thickness no greater than 15 Angstroms is of a thickness from 5 Angstroms to 10 Angstroms.

12. The method of claim 1, wherein the exposed elemental silicon-containing surface comprises polycrystalline silicon.

13. The method of claim 1, wherein the exposed elemental silicon-containing surface comprises monocrystalline silicon.

14. The method of claim 1, wherein the exposing occurs during the conductive reaction layer-depositing.

15. The method of claim 1, wherein the exposing only occurs during the conductive reaction layer-depositing.

16. The method of claim 1, wherein at least some of the exposing occurs prior to and separate from the conductive reaction layer-depositing.

17. The method of claim 16, wherein all of the exposing occurs prior to and separate from the conductive reaction layer-depositing.

18. The method of claim 1, wherein the conductive reaction layer has an outer portion that at least predominately comprises said first elemental metal.

19. The method of claim 18, wherein the conductive reaction layer outer portion consists essentially of said first elemental metal.

20. The method of claim 1, wherein the conductive reaction layer has an outer portion that at least predominately comprises said metal-rich silicide.

21. The method of claim 20, wherein the conductive reaction layer outer portion consists essentially of said metal-rich silicide.

22. The method of claim 1, wherein the reacting occurs during the conductive reaction layer-depositing.

23. The method of claim 1, wherein the reacting occurs after the conductive reaction layer-depositing.

24. The method of claim 23, wherein the reacting does not occur during the conductive reaction layer-depositing.

25. The method of claim 1, wherein the exposing and the reacting occur during the conductive reaction layer-depositing.

26. The method of claim 1, wherein the deposited layer of thickness no greater than 15 Angstroms has an as-deposited resistance greater than 1000 microohms-cm, the exposing and reacting being effective to reduce resistance of the deposited layer of thickness no greater than 15 Angstroms to less than 1000 microohms-cm.

27. The method of claim 1, wherein the layer of thickness no greater than 15 Angstroms comprises tantalum nitride.

28. The method of claim 27, wherein the conductive reaction layer comprises at least one of titanium and titanium-rich titanium silicide.

29. The method of claim 1, wherein the conductive metal silicide-comprising contact region has a thickness from 5 Angstroms to 100 Angstroms.

30. The method of claim 1, wherein the exposing, conductive reaction layer-depositing and reacting are effective to form all conductive metal silicide formed over the substrate by the reacting to have no more than 10% thickness variation as determined of a thickest portion of said conductive metal silicide formed by the reacting.

31. The method of claim 1, wherein the exposing, conductive reaction layer-depositing and reacting are effective to form all conductive metal silicide formed over the substrate by the reacting to have no more than 1% thickness variation as determined of a thickest portion of said conductive metal silicide formed by the reacting.

32. The method of claim 1, wherein the exposing, conductive reaction layer-depositing and reacting are effective to form all conductive metal silicide formed over the substrate by the reacting to have from 1% to 3% thickness variation as determined of a thickest portion of said conductive metal silicide formed by the reacting.

33. The method of claim 1, wherein the conductive reaction layer is of a thickness which is greater than that of the layer of thickness no greater than 15 Angstroms.

34. The method of claim 1, wherein the exposed elemental silicon-containing surface is received within a contact opening formed within an insulative layer.

35. A method of forming a conductive metal silicide by reaction of metal with silicon, comprising:
providing a semiconductor substrate comprising an exposed elemental silicon-containing surface;
depositing one or more monolayers to form a tantalum nitride-comprising layer onto the exposed elemental silicon-containing surface to a thickness no greater than 15 Angstroms, the deposited tantalum nitride-comprising layer having a resistance greater than 1000 microohms-cm;
exposing the tantalum nitride-comprising layer of thickness no greater than 15 Angstroms to plasma and depositing a conductive reaction layer comprising at least one of an elemental metal or metal-rich silicide onto the plasma-exposed layer; and
reacting said metal or metal-rich silicide of the conductive reaction layer with the elemental silicon of the substrate effective to form a conductive metal silicide-comprising contact region over the tantalum nitride-comprising layer which electrically connects the conductive reaction layer with the substrate; the exposing, depositing and reacting being effective to reduce resistance of the tantalum nitride-comprising layer to less than 1000 microohms-cm.

36. The method of claim 35, wherein the tantalum nitride-comprising layer as-deposited is of a thickness no less than 5 Angstroms.

37. The method of claim 35, wherein the tantalum nitride-comprising layer as-deposited is of a thickness from 5 Angstroms to 10 Angstroms.

38. The method of claim 35, wherein the exposing occurs during the conductive reaction layer-depositing.

39. The method of claim 35, wherein at least some of the exposing occurs prior to and separate from the conductive reaction layer-depositing.

40. The method of claim 35, wherein the conductive reaction layer has an outer portion that at least predominately comprises the elemental metal.

41. The method of claim 35, wherein the reacting occurs during the conductive reaction layer-depositing.

42. The method of claim 35, wherein the reacting occurs after the conductive reaction layer-depositing.

43. The method of claim 42, wherein the reacting does not occur during the conductive reaction layer-depositing.

44. The method of claim 35, wherein the exposing and the reacting occur during the conductive reaction layer-depositing.

45. The method of claim 35, wherein the exposing and reacting are effective to reduce resistance of the tantalum nitride-comprising layer to less than 800 microohms-cm.

46. The method of claim 35, wherein the exposing, conductive reaction layer-depositing and reacting are effective to form all conductive metal silicide formed over the substrate by the reacting to have no more than 10% thickness variation as determined of a thickest portion of said conductive metal silicide formed by the reacting.

47. The method of claim 35, wherein the exposing, conductive reaction layer-depositing and reacting are effective to form all conductive metal silicide formed over the substrate by the reacting to have no more than 1% thickness variation as determined of a thickest portion of said conductive metal silicide formed by the reacting.

48. The method of claim 35, wherein the exposing, conductive reaction layer-depositing and reacting are effective to form all conductive metal silicide formed over the substrate by the reacting to have from 1% to 3% thickness variation as determined of a thickest portion of said conductive metal silicide formed by the reacting.

* * * * *

UNITED STATES PATENT AND TRADEMARK OFFICE
CERTIFICATE OF CORRECTION

| | |
|---|---|
| PATENT NO. | : 7,358,188 B2 |
| APPLICATION NO. | : 11/362119 |
| DATED | : April 15, 2008 |
| INVENTOR(S) | : Basceri |

It is certified that error appears in the above-identified patent and that said Letters Patent is hereby corrected as shown below:

On the face page, in field (54), in "Title", in column 1, line 1, delete "METHOD" and insert -- METHODS --, therefor.

In column 1, line 1, delete "METHOD" and insert -- METHODS --, therefor.

Signed and Sealed this

First Day of July, 2008

JON W. DUDAS
*Director of the United States Patent and Trademark Office*